(12) United States Patent
Kirchner

(10) Patent No.: US 10,347,349 B2
(45) Date of Patent: Jul. 9, 2019

(54) METHOD AND DEVICE FOR FAIL-SAFE ERASE OF FLASH MEMORY

(71) Applicant: Harman Becker Automotive Systems GmbH, Karlsbad-Ittersbach (DE)

(72) Inventor: Daniel Kirchner, Pfinztal (DE)

(73) Assignee: HARMAN BECKER AUTOMOTIVE SYSTEMS GmbH, Karlsbad-Ittersbach (DE)

( * ) Notice: Subject to any disclaimer, the term of this patent is extended or adjusted under 35 U.S.C. 154(b) by 379 days.

(21) Appl. No.: 15/233,738

(22) Filed: Aug. 10, 2016

(65) Prior Publication Data

US 2017/0052734 A1    Feb. 23, 2017

(30) Foreign Application Priority Data

Aug. 17, 2015 (EP) ..................................... 15181284

(51) Int. Cl.
| | |
|---|---|
| *G06F 3/06* | (2006.01) |
| *G11C 16/16* | (2006.01) |
| *G11C 16/22* | (2006.01) |
| *G11C 16/34* | (2006.01) |

(52) U.S. Cl.
CPC ........ *G11C 16/3445* (2013.01); *G06F 3/0608* (2013.01); *G06F 3/0652* (2013.01); *G06F 3/0679* (2013.01); *G11C 16/16* (2013.01); *G11C 16/22* (2013.01)

(58) Field of Classification Search
CPC ..... G11C 16/16; G11C 16/22; G11C 16/3445; G06F 3/0608; G06F 3/0652; G06F 3/0679
See application file for complete search history.

(56) References Cited

U.S. PATENT DOCUMENTS

| | | | |
|---|---|---|---|
| 2001/0012222 A1* | 8/2001 | Terasaki | G06F 12/0246 |
| | | | 365/200 |
| 2001/0019501 A1 | 9/2001 | Otani et al. | |
| 2003/0099134 A1 | 5/2003 | Lasser et al. | |
| 2004/0105324 A1 | 6/2004 | Sakurai et al. | |
| 2011/0022778 A1 | 1/2011 | Schibilla et al. | |

(Continued)

FOREIGN PATENT DOCUMENTS

WO    2013147894 A1    10/2013

OTHER PUBLICATIONS

Extended European Search Report Application No. 15181284.9, dated Feb. 24, 2016, 7 pages.

*Primary Examiner* — Harry W Byrne
*Assistant Examiner* — R Lance Reidlinger
(74) *Attorney, Agent, or Firm* — Artegis Law Group, LLP

(57) ABSTRACT

The present disclosure provides a flash memory device including a flash memory comprising a plurality of nonvolatile memory cells, divided into a plurality of erase units; a memory section dedicated to storing erase status information, the erase status information indicating an erase status of the plurality of erase units; and a memory controller configured to receive an erase request indicating at least one erase unit; store erase status information for the at least one erase unit in the memory section; perform an erase operation on the at least one erase unit; and update the stored erase status information upon completion of the erase operation. In addition, the present disclosure provides a way how incomplete erase commands can be handled transparently in a fail safe way.

17 Claims, 5 Drawing Sheets

(56) References Cited

U.S. PATENT DOCUMENTS

| | | | |
|---|---|---|---|
| 2011/0145483 A1* | 6/2011 | Sudo | G06F 12/0246 |
| | | | 711/103 |
| 2013/0077399 A1* | 3/2013 | Kang | G11C 11/5635 |
| | | | 365/185.2 |
| 2016/0379715 A1* | 12/2016 | Pelster | G11C 16/16 |
| | | | 365/185.12 |

\* cited by examiner

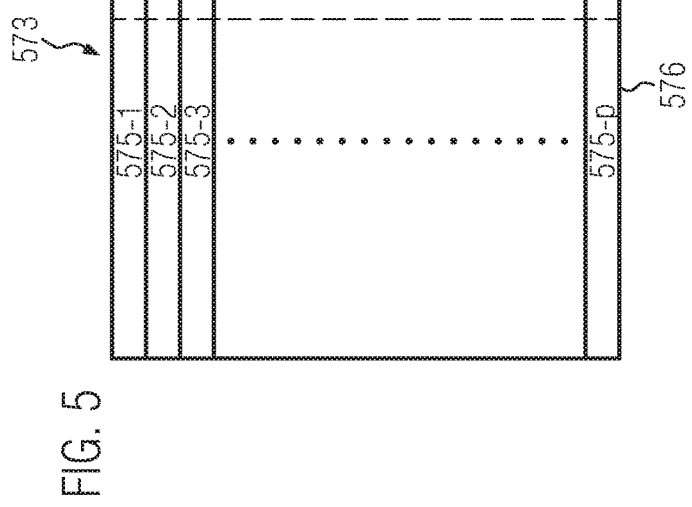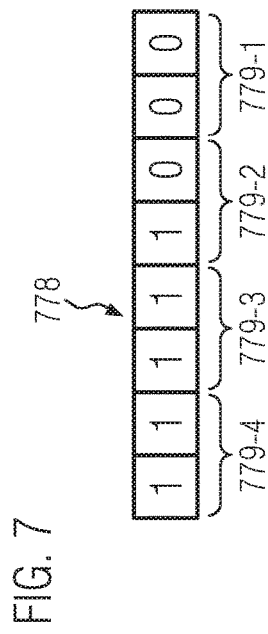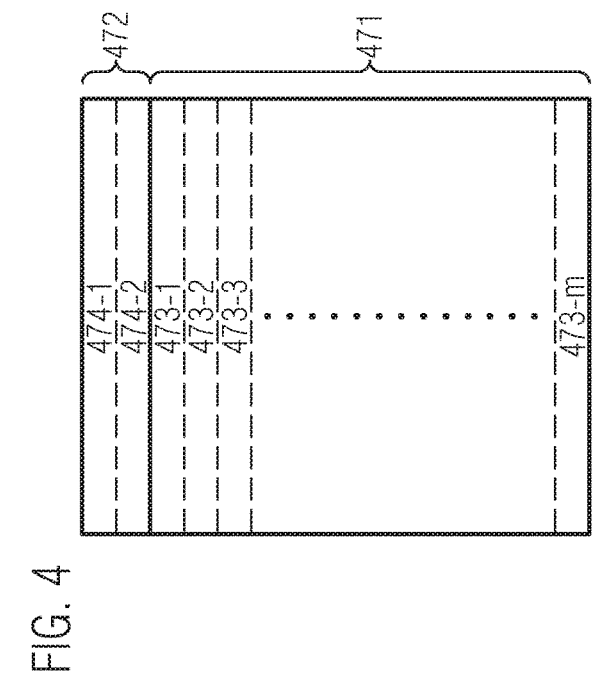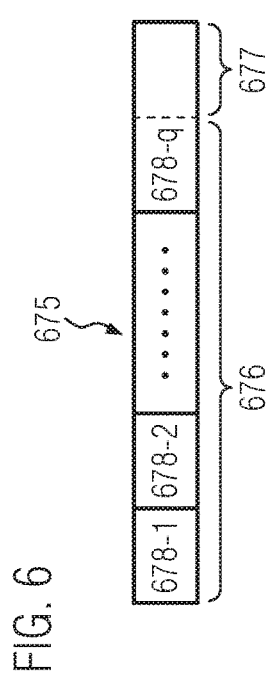
FIG. 4
FIG. 5
FIG. 6
FIG. 7

METHOD AND DEVICE FOR FAIL-SAFE ERASE OF FLASH MEMORY

CROSS-REFERENCE TO RELATED APPLICATIONS

This application claims priority to the European patent application titled, "METHOD AND DEVICE FOR FAIL-SAFE ERASE OF FLASH MEMORY," filed on Aug. 17, 2015 and having Application No. 15 181 284.9. The subject matter of this related application is hereby incorporated herein by reference.

FIELD OF INVENTION

The present disclosure relates to a method and a device for a fail-safe erase operation of flash memory units.

BACKGROUND OF THE INVENTION

Semiconductor memory devices may generally be classified as volatile or nonvolatile memory, depending on whether the device is able to retain stored data in the absence of applied power. Among the various types of nonvolatile memory, so-called flash memory has gained increasing popularity with the advent of mobile electronic systems such as laptops, tablet computers and smart phones. Flash memory is a term used to describe a class of electrically erasable and programmable nonvolatile memory devices based on the use of floating gate transistors wherein data is written or "programmed" to the device by trapping electrons in the floating gate using Fowler-Nordheim tunneling, known from EEPROM technology, or hot electron injection, known from EPROM technology. A plurality of different types of flash memory is known and categorized according to the architecture of their arrays of floating gate transistors. The most popular among these are the so-called NOR flash and NAND flash devices.

In NOR flash, each memory cell, i.e. floating gate transistor, has one end connected directly to ground, and the other end connected directly to a bit line. The low read latencies characteristic of NOR devices allow for both direct code execution and data storage in a single memory product. In NAND flash, several transistors are connected in series with a common connection to ground. As a result, data must be read on a block-wise basis, with typical block sizes of hundreds to thousands of bits. On the plus side, NAND flash comes with reduced erase and write times, and requires less chip area per cell, thus allowing greater storage density and lower cost per bit than NOR flash. Both architectures have in common that an erase operation can be performed only on a block-wise basis, generally by setting all bits in the block to a bit value of '1', i.e. an erase state. Due to the nonvolatile nature of the memory, rewriting to an already programmed block is furthermore only possible in limited situations, namely when the new data's '0' bits are a superset of the over-written data's '0' bits, wherein a bit value of '0' represents a program state P. By way of example, 1010 may be rewritten into 0010, while it cannot be rewritten into 1110 without first erasing the entire block. In any case, a fully programmed block, i.e. having all bits in a program state, e. g. 0000 in the above example, cannot be re-programmed without being first erased.

As a consequence, over-writing existing data on a flash memory device often involves writing the new data to an empty, i.e. erased block, and erasing the old data in the original block, accompanied by an adaptation of a corresponding memory map between the logical page addresses (LPAs) and the physical page addresses (PPAs) of the memory blocks. This so-called copy-over and erase algorithm is generally automatically performed by a controller of the flash memory device or the external host. Due to the rather long duration of an erase operation, which may last from approximately 1 ms up to 1000 ms for a typical memory block, depending on the type of flash memory and the number of program/erase cycles, that the block has already encountered, the erase request for the over-written blocks is typically scheduled for execution at a later time. Consequently, users may occasionally disconnect a flash memory device, such as a memory stick or external solid state drive, from its power supply or power down the flash memory device before all scheduled erase operations have been completed, with unpredictable results for the status of the memory cells in partially erased blocks. An attempt to read data from such partially erased blocks will then likely return random, unstable or similar but not identical data with potentially catastrophic consequences for the application relying on the data.

For the above reasons, a fail-safe erase mechanism for flash memory devices is needed. The present disclosure provides such a fail-safe erase mechanism and a corresponding memory device which allows to safely erase data without having to modify the host software for accessing data on the device.

DESCRIPTION OF THE INVENTION

The technical problems described above are solved by a method of operating a flash memory device comprising a plurality of nonvolatile memory cells, the method comprising: receiving an erase request, in particular from an external host, indicating at least one erase unit, each erase unit comprising an, in particular fixed, number of nonvolatile memory cells; storing erase status information in a memory of the flash memory device, wherein the erase status information indicates a pending erase request; performing an erase operation on the at least one erase unit; and upon completion of the erase operation updating the erase status information in the memory of the flash memory device.

Here and in the following, a request, e. g. an erase request, a programming/write request or a read request may be received as a request signal or a request message, in particular including corresponding request data.

As described above, a flash memory device comprises a plurality of nonvolatile memory cells which may be organized in the form of a two-dimensional or three-dimensional array of memory cells. Each memory cell may comprise one or several of the above described floating gate transistors, wherein it is assumed for simplicity in the following that each memory cell comprises only one floating gate transistor for storing one bit in the form of a single level memory cell (SLC). Alternatively, multi-level memory cells (MLC) for storing two or more bits in a single memory cell can be used. The mechanisms and devices described in the following can be applied to SLCs as well as MLCs. Furthermore, any architecture of the flash memory device, whether NOR, NAND, DINOR, AND or the like, may be employed. The flash memory device can be any one of the known devices, such as a BIOS chip, CompactFlash, SmartMedia, Memory Stick, PCMCIA Type I and Type II memory cards, e. g. used as solid state disks in laptops or tablet computers, memory cards, or the like.

The plurality of nonvolatile memory cells is divided into a plurality of erase units which represent the smallest addressable unit for erase operations. By way of example, the plurality of memory cells can be organized in pages which are grouped into blocks, which are themselves grouped into planes. Finally, several planes may be grouped on a die of nonvolatile memory, thereby realizing a three-dimensional memory structure. Without limitation, a page may store 8 kB (kByte) of user data with 512 Byte of parity data for error correction. 128 or 256 pages may be combined into one block. Depending on the size of the memory device, 1024 or 2048 blocks may be placed on one plane of a die, which may have 1, 2 or 4 planes. The numbers may vary depending on the type and size of the memory device. However, the memory cells can only be erased group-wise in the form of erase units, which are typically blocks, sometimes pages, of the memory device. In general, each erase unit comprises the same, fixed number of nonvolatile memory cells. However, certain memory devices exist, whose block sizes may be changed over time to account for unusable memory cells due to the well known wearing out of nonvolatile memory cells after a certain number of P/E (Program/Erase) Cycles (typically between 1000 and 100 000 P/E cycles for NAND-type flash memory and 100 000-1 000 000 P/E cycles for NOR-type flash memory). Varying block sizes may be coped with by a corresponding memory controller of the flash memory device, in particular, by using a flash translation layer, mapping the respective logical page addresses (LPAs) to physical page addresses (PPAs).

According to the present disclosure, an erase request indicating at least one erase unit is received. The erase request may for instance be received by a memory controller of the flash memory device, as a result of an erase request received from an external host or a programming/write request which involves the well-known copy-over and erase algorithm described below. As such, the erase request may be received by the flash memory device from an external host. The external host may for instance be a personal computer, a laptop computer, a tablet computer, a smart phone, a digital camera, a headunit of a vehicle, or any other electronic device which the flash memory device may be connected to. The flash memory device may be connected via any of the known interfaces, such as a USB connector, a PCMCIA connector, an ATA connector, an SATA connector, an SCSI connector, an ESDI connector, an IDE connector, a firewire connector, an HDMI connector, or the like to the external host. Alternatively or additionally the flash memory device may be connected wirelessly to the external host. In this case in particular, a dedicated power supply for the flash memory device may be provided.

The erase request may comprise one or several LPAs and/or PPAs to indicate the erase units to be erased. The LPAs and/or PPAs may be included as a list or as boundaries delimiting one or several continuous memory sections consisting of multiple erase units. As mentioned above, an erase request may also result from a programming/write request which updates already stored data and therefore involves writing a new copy of the changed data over to a fresh programming/write unit, remapping the mapping information between the corresponding LPAs and PPAs and erasing the erase unit, holding the old data, later when the flash memory device is idle. Similarly to erase units, programming/write units are defined by a certain number of nonvolatile memory cells and typically coincide with the read units, as described below. By means of a flash translation layer, the programming/write units indicated in the programming/write request may be mapped to corresponding erase units, which shall be erased. For simplicity, erase operations as a result of such a programming/write request are therefore treated here and in the following as an erase request, even if the mapping may be executed by a controller of the flash memory device, rather than the external host.

According to the present disclosure, erase status information indicating a pending erase request is stored in a memory of the flash memory device. In particular, erase status information may be stored in the memory for each pending erase request. In one embodiment, erase status information may be stored for each received erase request, while in a different embodiment, erase status information is only stored for those of the received erase requests which are scheduled by the flash memory device to be executed at a later time, e. g. when the flash memory device is idle. The erase status information may in particular be stored directly after receiving the erase request, i.e. before initiating the physical erase operation for the corresponding erase units.

The memory, where the erase status information is stored, may be nonvolatile memory, in particular flash memory.

After the erase status information has been stored, an erase operation is performed by the flash memory device on the at least one erase unit. This erase operation refers to the physical erase operation for the corresponding erase units wherein the floating gate transistors of the erase units are reset to an erase state, generally to a logical 1 (or 11 for MLCs), by executing a memory-type dependent erase algorithm. The erase operations may be performed in parallel on multiple erase units or consecutively on one erase unit at a time, depending on a controller of the flash memory device.

Upon completion of the erase operation, the erase status information is updated in the memory of the flash memory device. Depending on the type of erase status information, this information may be updated once, upon completion of the erase operation for all of the erase units indicated in the erase request, or updated multiple times, upon completion of the erase operation for each of the erase units indicated in the erase request. The updating may include modifying and/or partially erasing the erase status information in the memory of the flash memory device. Further details will be given below.

In one particular embodiment, storing the erase status information may comprise setting a flag indicating a pending erase operation for each of the at least one erase unit in the memory of the flash memory device.

To this end, a mapping between the plurality of the erase units of the flash memory device and memory elements of the memory for storing erase status information may be implemented via hardware arrangement, e. g. by providing an array of memory elements corresponding in size and dimensions to the array of erase units, or via software, e. g. by generating a corresponding erase unit map in a flash translation layer. Setting a flag may be achieved by a number of options such as dedicating an even number of nonvolatile memory cells (SLCs or MLCs) of the memory to the storage of a single flag, dedicating one MLC to each flag or dedicating one bit of an EEPROM-type memory to store a single flag. More details for the setting of the flags will be given below.

By determining that a flag has been set, a controller of the flash memory device and/or the external host can determine that an erase operation for a particular erase unit of the flash memory device is still pending. Due to the nonvolatile nature of the memory in which the erase status information is stored, this information on pending erase operations is not lost when the flash memory device is disconnected from the external host and/or powered down.

In one embodiment, updating the erase status information may in particular comprise setting a further flag indicating completion of the erase operation for each of the at least one erase unit in the memory upon completion of the respective erase operation, or resetting the flag indicating the pending erase operation for each of the at least one erase unit in the memory upon completion of the respective erase operation.

In the first case, the erase status information comprises at least a first flag for indicating a pending erase operation for each of the at least one erase unit and a second flag for indicating completion of the pending erase operation for each of the at least one erase unit. If only the first flag is set, a controller will determine that the corresponding erase operation is still pending and initiate the necessary steps. If both the first and the second flags are set, the controller will determine that the pending erase operation has been completed and that the erase unit is available again for programming. As a consequence, a partial erase of an erase unit will not be misinterpreted anymore as a completed erase and the known negative consequences can be avoided. This method may be applied by dedicating an even number of nonvolatile memory cells of the memory for storing the erase status information to each erase unit. Dedicating multiple pairs of nonvolatile memory cells allows repeating the above described storage and update of erase status information for a particular erase unit.

In the second case, the erase status information comprises a single flag for each of the at least one erase unit. As long as the flag is set, a controller will determine that the corresponding erase operation is still pending. Depending on the hardware implementation, resetting a flag can be achieved in various ways. For EEPROM-type memory, a binary flag will simply be reset to its basic state. For MLCs of nonvolatile memory, such as a four-level storage cell, a set flag may be realized by an intermediate threshold voltage, such as "10" or "01", while a reset flag is realized by a higher threshold voltage, such as "00" (if '11' defines the ground state of the MLC). To allow for repeated P/E cycles, several MLCs may be dedicated to each erase unit.

In an alternative embodiment, storing the erase status information may comprise storing mapping information for the at least one erase unit in the memory, and updating the erase status information may comprise erasing the mapping information. As mentioned above, the mapping information may comprise a list of physical page addresses (PPAs) of the erase units indicated in the erase request and/or the boundary PPAs of continuous memory sections to be erased. The memory for storing the erase status information may be operated according to the First In First Out (FIFO) principle such that a controller of the memory device will read the stored mapping information, perform the corresponding erase operations and erase the corresponding mapping information when a particular erase operation has been completed. The stored mapping information may further be read as part of an initialization procedure of the flash memory device when said flash memory device is (re-)connected to the external host and/or powered-up. A controller of the flash memory device may perform such an initialization procedure to complete all incomplete erase operations.

As mentioned above, the memory for storing the erase status information may be a nonvolatile memory. It may in particular be a section of the plurality of nonvolatile memory cells. It may, however, also be an EEPROM-type memory, provided in addition to the plurality of nonvolatile memory cells. The memory may further be provided as a dedicated memory unit or part of a memory unit, separate from the plurality of nonvolatile memory cells. As such, the type of the nonvolatile memory cells of the memory for storing the erase status information may differ from the type of the nonvolatile memory cells of the plurality of nonvolatile memory cells of the flash memory device, which are dedicated to the storage of bulk data. By way of example, the memory for storing the erase status information may be a NOR-type flash memory to allow storing and reading the erase status information faster than in the usual NAND-type flash memory for the bulk memory of the flash memory device. However, the memory for storing the erase status information may also be provided as a section of the plurality of nonvolatile memory cells and thus be of the same memory type. In this case, the disclosed fail-safe erase method may be implemented in existing flash memory devices without having to modify the hardware structure.

The method for operating a flash memory device may further comprise: receiving a read request or programming/write request, in particular from the external host, indicating at least one read unit or programming/write unit, each read unit or programming/write unit comprising an, in particular fixed, number of nonvolatile memory cells; determining whether at least one erase unit corresponding to the at least one read unit or programming/write unit has not been completely erased, based on the stored erase status information; and returning a signal indicating a program state P for the at least one incompletely erased erase unit, in particular a signal indicating the at least one incompletely erased erase unit to be fully programmed.

A programming/write unit represents the smallest addressable unit for programming/writing operation and may in particular coincide with a read unit, which represents the smallest addressable unit for read operations. For simplicity, the term programming/write unit is therefore used, here and in the following, as representing both programming/write units and read units. Generally, programming/write units are defined as sub-units of erase units of a flash memory, such that each erase unit comprises a plurality of programming/write units. In NAND-type flash, an erase unit may for instance be defined as a block of nonvolatile memory cells, while a programming/write unit may be defined as a page of nonvolatile memory cells. As a consequence, each erase unit comprises a plurality of programming/write units. Alternatively, erase unit and programming/write unit may refer to the same group of nonvolatile memory cells, e. g. a block or a page. In NOR-type flash, even a single machine word or byte may be programmed/written and read such that a very small programming/write unit of a single machine word or byte may be realized. The present disclosure is, however, not limited to the given examples but may be implemented for any division of the plurality of nonvolatile memory cells as long as each programming/write unit is entirely included in a single erase unit. The number of nonvolatile memory cells forming a programming/write unit may be the same for all programming/write units.

The read request or programming/write request received by a controller of the flash memory device, in particular from the external host, indicates at least one programming/write unit whose content shall be read or programmed with content provided to or from the external host. Upon reception of the read request or programming/write request, the controller of the flash memory device may analyze the read request or programming/write request and determine the erase unit(s) corresponding to the at least one programming/write unit. This operation may be performed by means of a flash translation layer installed in a firmware unit of the controller. According to the present embodiment, the controller then determines whether any of the at least one erase unit among the determined erase unit(s) has not been completely erased. This determination is performed on the basis of the stored status information by reading and checking the stored status information for each of the at least one erase unit as described above.

If the controller determines that at least one erase unit has not been completely erased, for instance because the flash memory device was disconnected from the external host or powered down during the erase operation, or because of any other reason leading to an incompletely erased erase unit, the controller of the flash memory device may return a signal indicating a program state P for the at least one incompletely erased erase unit. The signal indicating a program state P for the at least one incompletely erased erase unit may in particular be a signal indicating the at least one incompletely erased erase unit to be fully programmed. As an example, the controller may return a bit indicating a program state P, i.e. typically a bit value of '0', for each bit of the incompletely erased erase unit or the corresponding programming/write unit or read unit. Alternatively, the controller may return an arbitrary, but pre-defined signal indicating that the incompletely erased erase unit is fully programmed which can be understood as such by an external host.

Upon reception of the above described signal, the external host may determine that data cannot be programmed to the at least one incompletely erased erase unit and as a consequence send an erase request indicating the at least one incompletely erased erase unit to the flash memory device. Upon reception of such an erase request, the controller of the flash memory device will then automatically schedule an erase operation on the at least one incompletely erased erase unit, which may in particular be carried out in an idle state of the flash memory device.

Consequently, the controller of the flash memory device treats an incompletely erased erase unit as a fully programmed erase unit after the reception of a read request or programming/write request for at least one read unit or programming/write unit comprised by such an incompletely erased erase unit. To the outside, i.e. to an external host, the incompletely erased erase unit appears like a fully programmed erase unit such that an external host will automatically determine that data cannot be written to the erase unit before it is erased. The external host will therefore automatically send an erase request, indicating the incompletely erased erase unit, to the flash memory device. Also, the external host will always read such an incompletely erased erase unit as a fully programmed erase unit such that reading of unstable data can be avoided. As a consequence, no changes to the software of the external host are required for implementing the disclosed method. Also, even simple controllers of flash memory devices, which are limited to executing operations, triggered by an external host, can be used with the disclosed method such that it can be applied to simple and cheap flash memory devices.

Alternatively, the controller of the flash memory device may schedule the at least one incompletely erased erase unit for an erase operation upon determination that the erase unit has not been completely erased. This scheduling for a later erase operation may be performed according to any of the methods known in the art. By way of example, the erase operation for the at least one incompletely erased erase unit may be scheduled for a time when the flash memory device is idle.

As mentioned above, alternatively or additionally, the controller may be configured to examine the stored status information upon initialization of the flash memory device and/or at regular intervals with respect to incompletely erased erase units and schedule detected incompletely erased erase units for an erase operation. Also, the controller may be configured to examine the stored status information for any erase unit corresponding to a read unit indicated in a read request, received by the controller, in particular from the external host. If it is determined by the controller, that the external host attempts to read from an incompletely erased erase unit, the controller may return a signal indicating a fully programmed erase unit such that no unstable or random data is read by the external host. In addition, the controller may schedule the incompletely erased erase unit for a later erase operation, as described above. Consequently, partially erased erase unit may also be detected upon initialization of the flash memory device and if an external host attempts to read from them. In addition, this behavior ensures a well defined behavior of the client receiving the data read, as the data passed to the client will not be random or unstable.

With the above described method of operation, a fail-safe erase method for flash memory is achieved since incompletely erased erase units are safely detected, in particular as a result of a corresponding read request, and completely erased. As a consequence, reading of corrupted data from partially erased erase units can be effectively ruled out.

As mentioned above, the erase operation on the at least one incompletely erased erase unit may in particular be completed in an idle state of the flash memory device. The described method may therefore advantageously be combined with existing erase algorithms for flash memory which schedule erase units to be erased for a time when the flash memory device is in an idle state.

As further mentioned above, the determining step may comprise mapping the at least one programming/write unit to the at least one erase unit corresponding to the at least one programming/write unit and reading stored status information corresponding to the mapped at least one programming/write unit. Such a mapping may in particular be required if an erase unit comprises more than one programming/write unit and may be performed by means of a flash translation layer installed in a controller of the flash memory device. After mapping has been completed, the controller may read the erase status information stored in the above described memory of the flash memory device and corresponding to the mapped at least one erase unit and determine whether any of the mapped at least one erase unit has not been completely erased.

In case the external host attempts to write to a partially erased erase unit, the present method treats an incompletely erased erase unit in the same way as a fully programmed programming unit, such that the above described copy-over and erase mechanism is automatically applied. The data to be written will thus be programmed into a fresh programming unit while the incompletely erased erase unit is scheduled for a later erase operation.

The present method allows implementing a fail-safe erase operation in existing flash memory devices by updating the flash translation layer stored in a firmware unit of their controllers to implement the above described method steps. No hardware updates, particularly not on the side of the external host, are required. A flash memory device implementing the present method will operate normally with respect to the requirements and specifications of an external host. No modification of the communication or signaling between external host and flash memory device is required. For better performance, part of the disclosed mechanism may be implemented as hardware in new memory devices, e.g. by dedicating a specific part of the nonvolatile memory to the storage of the erase status information and by mapping it to the erase units.

The present disclosure further includes a flash memory device comprising: a flash memory comprising a plurality of nonvolatile memory cells, divided into a plurality of erase units; a memory section dedicated to storing erase status information, the erase status information indicating an erase status of the plurality of erase units; and a memory controller configured to receive an erase request indicating at least one erase unit, store erase status information for the at least one erase unit in the memory section, perform an erase operation on the at least one erase unit, and update the stored erase status information upon completion of the erase operation.

Equivalent modifications and extensions as described above with respect to the method of operating a flash memory device may also be applied to the flash memory device, including its components. The plurality of nonvolatile memory cells may for instance be SLCs or MLCs. Their architecture may be of NOR-type, NAND-type, DINOR-type, AND-type or the like. The plurality of nonvolatile memory cells may be arranged in a two-dimensional array or a three-dimensional array. The flash memory device itself may be a BIOS chip, CompactFlash, SmartMedia, Memory Stick, PCMCIA Type I and Type II memory cards, e. g. used as solid state disks in laptops or tablet computers, memory cards, or the like.

The plurality of nonvolatile memory cells may be organized into pages, blocks, planes and dies. The erase unit may correspond to a block or a page, while the programming/write unit and/or read unit may correspond to a block, a page or even a single machine word (byte).

The flash memory device may comprise a data connector, such as a USB connector, a PCMCIA connector, a firewire connector, an HDMI connector, PCB wiring or direct PCB soldering or the like to be connected to an external host, such as a personal computer, a laptop computer, a tablet computer, a smart phone, a digital camera, a headunit of a vehicle, or any other electronic device which a flash memory device may be connected to. Alternatively or additionally, the flash memory device may comprise a transceiver to wirelessly exchange data with an external host. Furthermore, a dedicated power supply and/or a power supply connector, possibly as part of the data connector, may be provided as part of the flash memory device. Data received and sent via the data connector may be passed through an interface of the flash memory device configured to process and distribute incoming and outgoing data.

The memory section dedicated to storing erase status information as described above in detail may be part of a dedicated memory unit or part of the plurality of nonvolatile memory cells, which serve as the bulk storage. The memory section may in particular be nonvolatile memory. The memory section may be organized such as to allow mapping between the plurality of erase units of the flash memory device and a plurality of memory elements dedicated to storing the erase status information of the corresponding erase units. The mapping may be implemented in hardware by arranging the memory elements of the memory section to correspond to the erase units of the flash memory device or via software, e. g. by generating a corresponding erase unit map in a flash translation layer. To this end, the memory controller may comprise a firmware unit where the flash translation layer is installed. The memory section may comprise an even number of nonvolatile memory cells (SLCs or MLCs), one MLC or one bit of an EEPROM-type memory per erase unit of the flash memory device.

The memory section may be configured to store erase status information in the form of machine words (or bytes), in particular in the form of pointers indicating the PPAs of the corresponding erase units or boundaries of continuous sections of erase units, specified in the erase request received by the memory controller. The memory section may be operated according to the FIFO principle. The memory section may be a NOR-type flash memory or a NAND-type flash memory.

The memory controller may be provided as a central control unit of the flash memory device. As such, the memory controller is responsible for the control of programming, updating, reading and erasing operations on the plurality of nonvolatile memory cells. It may also carry out further well-known operations such as wear-leveling or error code checking. To be able to perform these control operations, the memory controller is connected to the corresponding components of the flash memory device such as the above mentioned interface, data connector, transceiver, power supply connector and the plurality of nonvolatile memory cells, i.e. the actual flash memory, and may have itself a number of internal components such as a host interface, a firmware unit, a control unit, a memory interface, a dedicated memory unit, RAM, or the like. The flash memory may further comprise an address decoder, a control unit and a data I/O circuit for reading and writing data and performing erase operations.

According to the present disclosure, the memory controller is configured to perform an erase operation on at least one erase unit indicated in a received erase request. To this end, the memory controller may perform the above described method steps and carry out a suitable erase algorithm on the at least one erase unit.

In one embodiment, the memory section may be arranged as part of the flash memory. As described above, a subset of the nonvolatile memory cells may be mapped to the erase units of the flash memory and used to store erase status information for the erase units. The memory section may comprise two such mapped groups of memory cells to allow for a copy-over and erase operation as known for an update request. The memory section may be defined in terms of hardware, e. g. providing a dedicated part of the flash memory for storing the erase status information which cannot be used for storing user data, or in terms of software by installing, i.e. storing, a flash translation layer adapted to define a memory section dedicated to storing the erase status information, e. g. by implementing the above described mapping, in a firmware unit of the memory controller. The flash translation layer may in particular be stored in a nonvolatile memory of the firmware unit, for instance of EPROM- or EEPROM-type. By arranging the memory section as part of the flash memory, no other hardware updates than the update of the flash translation layer in the firmware unit may be required to implement the above described fail-safe erase mechanism.

In one particular embodiment, the flash memory may comprise a user section comprising a first part of the plurality of nonvolatile memory cells and a spare section comprising a second part of the plurality of nonvolatile memory cells, wherein the memory section is arranged as part of the spare section. In this embodiment, the user section is provided to store user data, such as audio data, video data or the like, while the spare section is provided to store metadata, such as error correction code (ECC) parity data and to mark a page or block of memory cells as bad. The user section and spare section are usually implemented using the same type of nonvolatile memory cells, but may also differ by type.

User and spare sections may be provided for each page or each block of the nonvolatile memory cells. According to the present disclosure, the flash translation layer may be modified to dedicate a part of the spare section to storing erase status information. By arranging the memory section as part of the spare section, an automatic mapping between the erase units, namely blocks, and the corresponding memory elements of the memory section is created. This arrangement is applicable as long as the spare sections are erased last in a physical erase operation. In this case, the stored erase status information is erased together with the erase unit.

In an alternative embodiment, an entire block or several blocks of the flash memory may constitute the memory section such that the erase units for the user section can be erased without affecting the spare section. In this case, the spare section differs from those parts of pages or blocks provided for ECC parity data and is exclusively dedicated to storing erase status information. Ideally, the spare section is arranged redundantly, e. g. by providing two blocks for the storage of the erase status information. In this case, an update of the erase status information may be carried out by writing the updated erase status information to an empty block and erasing the previously used block (copy-over and erase algorithm). This ensures that the erase status information may be updated without encountering a similar problem with a sudden disconnection or power down of the flash memory device.

In a further embodiment, the memory controller may comprise a memory unit and the memory section may be arranged as part of the memory unit. The memory unit may in particular comprise a nonvolatile memory part, which may be arranged as the memory section for storing erase status information. The same modifications as described above may be applied. Consequently, the memory unit may comprise an EEPROM-type memory section or a flash-type memory section. In particular, a NOR-type memory section may be provided as part of the memory unit of the memory controller. In addition, the memory controller may comprise a nonvolatile memory for storing the flash translation layer, e. g. a firmware unit, and a RAM memory for executing the flash translation layer.

As mentioned above, the memory controller may comprise a firmware unit, wherein the firmware unit comprises a flash translation layer, and wherein the firmware unit is configured to determine the erase status of at least one programming/write unit indicated in a programming/write request received by the memory controller, each of the at least one programming/write unit comprising an, in particular fixed, number of the nonvolatile memory cells of the flash memory. To this end the firmware unit may use the flash translation layer, installed in a nonvolatile memory of the firmware unit, to map the at least one programming/write unit indicated in the received programming/write request to corresponding erase units, as described in detail above. For each of the resulting erase units, the erase status information may be read from the memory section by the firmware unit and an erase status of the erase units may be determined as described above. The firmware unit may thus comprise a processing unit for performing the mapping and reading operations and may further be configured to load the flash translation layer into a RAM memory of the memory controller. Alternatively, a control unit of the memory controller may perform the above mapping and reading operations after reading the flash translation layer from the firmware unit into a RAM memory of the memory controller. A plurality of alternative embodiments is possible and included in the present disclosure.

In one particular embodiment, the firmware unit is further configured to return a signal indicating a program state P for an incompletely erased erase unit corresponding to the at least one programming/write unit, in particular a signal indicating the at least one incompletely erased erase unit to be fully programmed, as described above. To this end, the processing unit of the firmware unit reads the erase status information of a particular erase unit, determines whether the erase unit has not been completely erased by checking for erase status information indicating a pending erase request for the erase unit and returns a signal indicating a programming state, i.e. a series of '0' bits or "1" bits (for present day flash memory, '0' bits), for all the bits of the programming/write unit or programming/write units, indicated in the programming/write request and being part of the incompletely erased erase unit. Alternatively, the memory controller may load the flash translation layer from the firmware unit into a RAM memory of the memory controller and perform the above described steps using its own control unit.

By returning a signal indicating a program state for every bit of a programming/write unit included in a partially erased erase unit, the memory controller, in particular the firmware unit, makes an incompletely erased erase unit appear like a fully programmed erase unit to the external host such that no data can be written to incompletely erased flash memory and the incompletely erased erase unit is automatically scheduled, either by the external host or by the controller, for a renewed erase operation.

Further features and exemplary embodiments as well as advantages of the present disclosure will be explained in detail with respect to the drawings. It is understood that the present disclosure should not be construed as being limited by the description of the following embodiments. It should furthermore be understood that some or all of the features described in the following may also be combined in alternative ways.

FIG. 4 shows an exemplary division of a flash memory into a user section and a spare section, showing two blocks dedicated to the storage of erase status information.

FIG. 5 shows an exemplary structure of the dedicated blocks of FIG. 4 according to the present disclosure.

FIG. 6 shows an exemplary embodiment of arranging memory elements for the storage of erase status information for a plurality of erase units according to the present disclosure.

FIG. 7 shows a particular embodiment of defining flags in a nonvolatile memory for the storage of erase status information according to the present disclosure.

In the figures, identical reference signs indicate identical or similar components.

Figure 1:
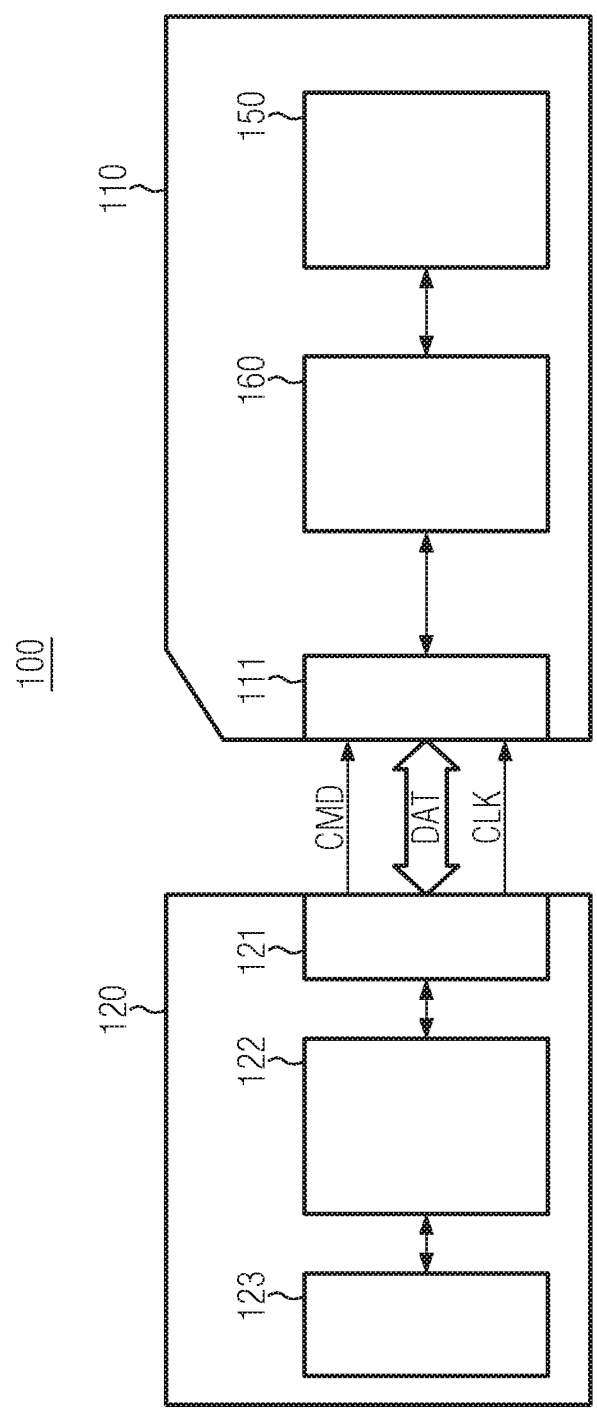
FIG. 1 shows a block diagram of an exemplary embodiment of a memory system comprising an external host and a memory card as a flash memory device according to the present disclosure.

A first exemplary embodiment of a flash memory device as a memory card is shown in FIG. 1 in the form of a block diagram. The exemplary memory card system 100 depicted in FIG. 1 includes an external host 120 and a memory card as the flash memory device 110. The external host 120 may include a host controller 122, a host connection unit 121 and a host memory unit 123, which may for instance be a DRAM.

The external host 120 may write data in the memory card 110 and read data from the memory card 110. The host controller 122 may send a command CMD, e. g. an erase request, a programming/write request or a read request, a clock signal CLK generated by a clock generator (not shown) in the external host 120 and, if necessary, data DAT to the memory card 110 via the host connection unit 121. The CMD may include information indicating at least one erase unit to be erased or indicating at least one programming/write unit to be programmed. The information may be included, for instance, as a list of physical page addresses (PPAs) indicating the pages of the flash memory to be erased or programmed. Alternatively, boundaries delimiting a continuous memory section to be erased or programmed may be included.

The flash memory device 110 may include a card connection unit 111, a memory controller 160 and a flash memory 150 comprising a plurality of nonvolatile memory cells. The memory controller 160 may store data in the flash memory 150 in response to a command input via the card connection unit 111. The data may be stored in synchronization with a clock signal generated by a clock generator in the memory controller 160 (not shown). The flash memory 150 may store data transferred from the external host 120. For example, in a case where the external host 120 is a digital camera, the flash memory 150 may store image data. If existing data shall be overwritten, the memory controller 160 may copy the new data over to an empty area of the flash memory 150 and erase the blocks of the flash memory 150 holding the old data ('copy-over and erase operation'). Equally, the memory controller 160 may erase parts of the flash memory 150 as a result of an erase request received from the external host 120 via the card connection unit 111.

The illustrated memory card 110 does not posses a separate power supply but is supplied with power by the external host 120 via the card connection unit 111. However, the present disclosure is not limited to the configuration shown in the figure but also includes flash memory devices with a dedicated power supply, such as a battery or a power supply connector.

According to the present disclosure, the memory controller 160 may receive an erase request indicating at least one erase unit of the flash memory 150 from the external host 120 via the card connection unit 111, store corresponding erase status information for the at least one erase unit in a memory section of the flash memory device 110, perform an erase operation on the at least one erase unit, and update the stored erase status information upon completion of the erase operation.

Figure 2:
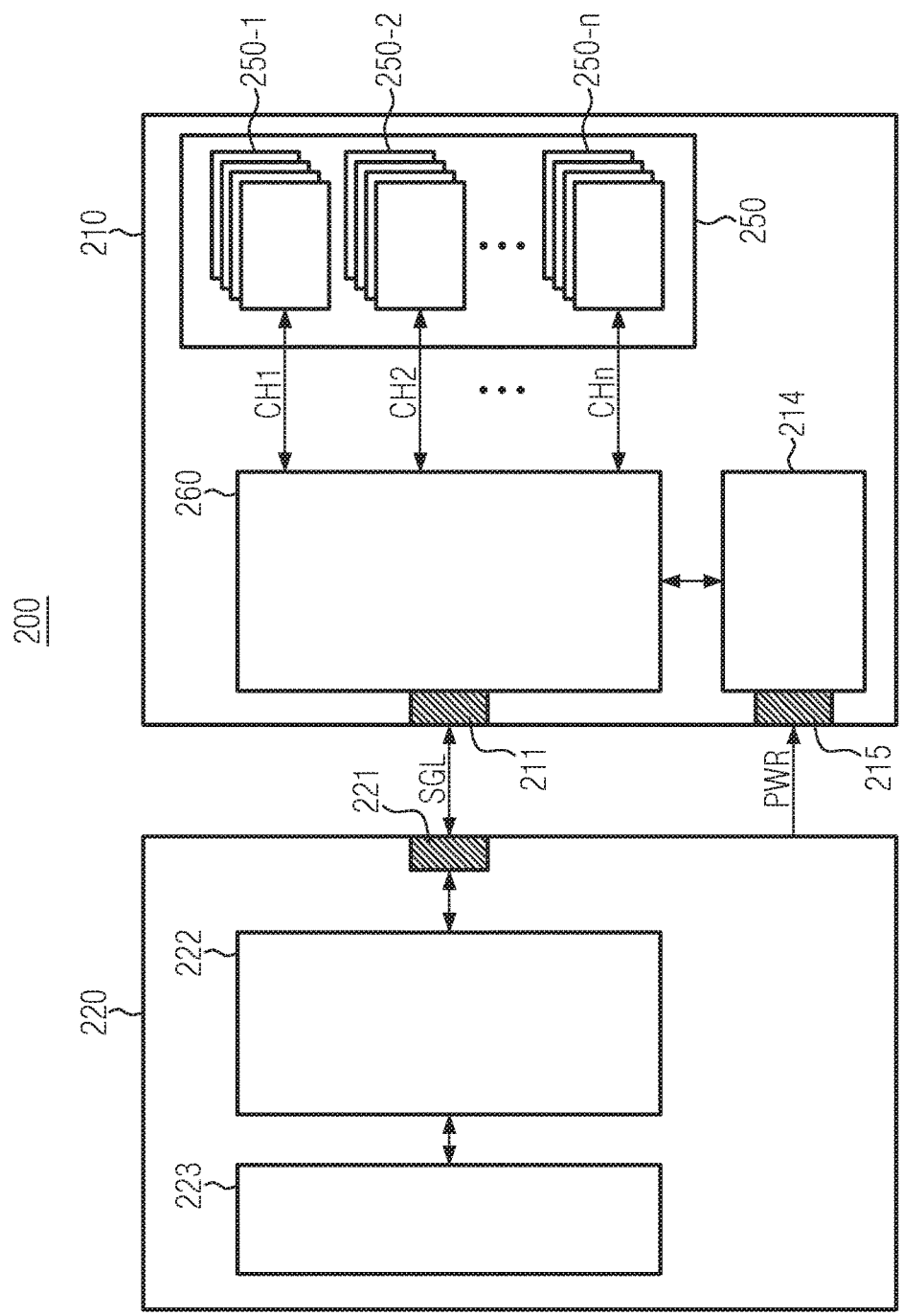
FIG. 2 shows a block diagram of a further exemplary embodiment of a memory system comprising an external host and a solid state drive as a flash memory device according to the present disclosure.

A further exemplary embodiment of a memory system according to the present disclosure is shown in FIG. 2 in the form of a block diagram. A solid state drive (SSD) system 200, including an SSD as the flash memory device 210 and an external host 220 is illustrated in the figure. As in FIG. 1, the external host 220 of FIG. 2 may include a host controller 222, a host memory unit 223, e. g. a DRAM, and a host connection unit 221, for instance in the form of an ATA, SATA, SCSI, ESDI or IDE interface. Throughout the entire disclosure, the term 'external host' shall be understood as referring to a host outside the flash memory device which may, however, form a combined memory system together with the flash memory device, such as a laptop computer including an SSD or a digital camera having a secure digital (SD) card.

The host 220 may write data in the SSD 210 or read data from the SSD 210. The host controller 222 may transfer signals SGL such as a command, an address, a control signal, and the like to the SSD 210 via the host connection unit 221. As mentioned above, these signals may include an erase request, indicating at least one erase unit of the flash memory 250 of the SSD 210 to be erased or a programming/write request indicating at least one programming/write unit of the flash memory 250 of the SSD 210 to be programmed. As mentioned, a programming/write request may involve a copy-over and erase operation and will thus often implicitly include an erase request.

The SSD 210 may exchange signals SGL with the host 220 via the drive connection unit 211 and may be supplied with power via a power connector 215. Without limitation, the SSD 210 according to the shown embodiment includes a flash memory 250 with a plurality of dies 250-1 to 250-n, each including four planes of nonvolatile memory, a memory controller 260, and an auxiliary power supply 214. Herein, the nonvolatile memory may be NAND-type, NOR-type, DINOR-type, AND-type or the like flash memory. The nonvolatile memory of the flash memory 250 may have a two-dimensional structure or a three-dimensional structure.

The plurality of dies 250-1 to 250-n of the flash memory 250 is used as a storage medium of the SSD 210. The flash memory 250 is connected with the memory controller 260 via a plurality of channels CH1 to CHn. One channel may be connected with one or more dies of the flash memory 250. Dies connected with one channel may be connected with the same data bus.

The memory controller 260 exchanges signals SGL with the external host 220 via the drive connection unit 211. Herein, the signals SGL include a command, an address, data and the like. The address may for instance include a list of PPAs or boundary PPAs of a continuous section of erase units to be erased. The memory controller 260 is configured to write or read out data to or from a corresponding die of the flash memory 250 according to a command received from the external host 220.

The auxiliary power supply 214 may be connected with the host 220 via the power connector 215. The auxiliary power supply 214 may be charged with a power PWR from the host 220. It may further be placed inside or outside the SSD 210. For example, the auxiliary power supply 214 may be provided on a main board of the host 220 to supply an auxiliary power to the flash memory device 210.

Figure 3:
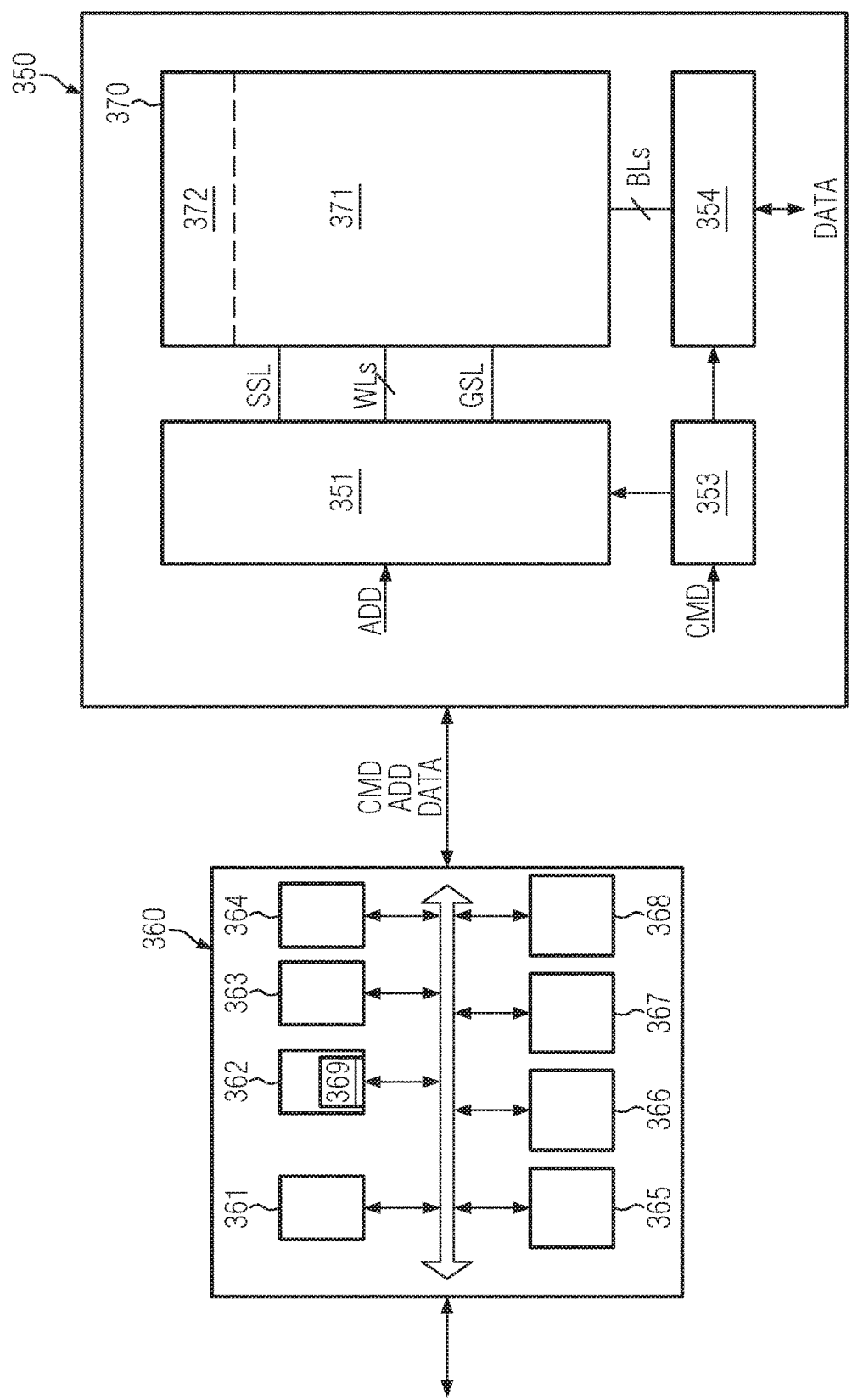
FIG. 3 shows a block diagram of an exemplary embodiment of a memory controller and a flash memory of a flash memory device according to the present disclosure.

A more detailed illustration of an exemplary embodiment of a memory controller 360 and a flash memory 350 of a flash memory device according to the present disclosure is shown in FIG. 3.

The memory controller 360 may be used to generally control operation of the flash memory device in response to requests received from an external host. As such the memory controller 360 controls the programming/writing of data to the flash memory 350, the reading of data from the flash memory 350, and the erasing of erase units of the flash memory 350. To this end, the memory controller 360 may send and receive commands CMD, addresses ADD, and data DATA to and from the flash memory 350. The exemplary memory controller 360 of FIG. 3 includes a host interface 361, a firmware unit 362 with a flash translation layer 369, a control unit 363, a memory interface 364, a memory unit 365, an error correction code (ECC) circuit 366, a wear level control logic 367 and a RAM 368. Further components may be included as needed. It shall also be understood that some of the components shown in FIG. 3 may be omitted, if not needed, e.g. wear-leveling is not included.

The host interface 361 provides an interface with an external host via a corresponding connector, connecting the flash memory device to the external host, as discussed above. The host interface may, however, also be provided as part of such a connector. The memory interface 364 provides an interface with the flash memory 350 through which the memory controller 360 exchanges commands CMD, addresses ADD, and data DATA. The control unit 363 controls an overall operation (e. g. reading, programming/writing, erasing, file system management, etc.) on the flash memory 350. The control unit 363 may include a CPU, a GPU, a processor, an SRAM, a DMA controller and the like, as generally known in the art. The RAM 368 may operate under the control of the control unit 363. It may be used as a work memory such that data processed by the control unit 363 may be temporarily stored in the RAM 368. The RAM 368 may also be used as a buffer when transferring data to and from the flash memory 350. In addition, the RAM 368 may be used by the control unit 363 to implement a flash translation layer (FTL) 369 stored in a nonvolatile memory of the firmware unit 362. The firmware unit 362 may control an overall operation of the memory controller 360 by using various signals generated by the host interface 361. Alternatively, the firmware unit 362 may provide subsidiary control, e. g. for copy-over and erase operations, mapping of LPAs and PPAs, and the like, in addition to the control unit 363.

Under the control of the control unit 363 and/or a dedicated processing unit of the firmware unit 362, logical page addresses (LPAs) may be mapped to physical page addresses (PPAs) of the flash memory 350 using the flash translation layer 369. Also, elements of the above described method, e. g. the storing, updating and checking of erase status information of the erase units of the flash memory 350, may be performed by the control unit 363 and/or the processing unit of the firmware unit 362 by means of the flash translation layer 369.

As mentioned above, the memory controller 360 may further comprise a memory unit 365, which may, in particular, be used to provide the above mentioned memory section dedicated to storing erase status information for the plurality of erase units of the flash memory 350. As such, the memory unit 365 may consist of or comprise a nonvolatile memory section, which may be an EEPROM-type memory, a NAND-type or NOR-type flash memory, or the like. According to the present disclosure, erase status information indicating a pending erase request may be stored in the memory unit 365 by the control unit 363 and/or the processing unit of the firmware unit 362. The stored erase status information may then be used to determine the erase status of a particular erase unit. If an incomplete erase operation is detected by the control unit 363 and/or the processing unit of the firmware unit 362, the corresponding erase unit is scheduled for a later erase operation and a signal indicating a program state is returned by the control unit 363 and/or firmware unit 362 for the bits of a programming/write unit included in such an incompletely erased erase unit in response to a programming/write request received from the external host and indicating this programming/write unit to be programmed. Application of a correspondingly adapted flash translation layer 369 by the control unit 363 and/or the processing unit of the firmware unit 362 thus prevents writing and reading corrupted data to and from an incompletely erased erase unit and automatically ensures that the erase operation is completed. To the external host, the respective erase unit will appear as a fully programmed erase unit. Upon completion of the physical erase operation, the corresponding erase status information stored in the memory unit 365 is updated by the control unit 363 and/or the processing unit of the firmware unit 362, as described in detail above.

As also described in detail above, the memory section dedicated to storing erase status information may be arranged as part of the nonvolatile memory cells of the flash memory 350. A detailed embodiment of this alternative will be explained below will respect to FIGS. 4 to 7 of the present disclosure. Similarly to the above described operation, the control unit 363 and/or the processing unit of the firmware unit 362 will perform the necessary steps by means of the flash translation layer 369 and via the memory interface 364.

The ECC circuit 366 may generate an error correction code (ECC), capable of detecting and/or correcting bit errors in the data to be stored or retrieved from the flash memory 350. The ECC circuit 366 may, for instance, perform error correction encoding on data provided from the flash memory 350 to form corresponding ECC data including parity data. The parity data may be stored in the nonvolatile memory 370 of the flash memory 350. The ECC circuit 366 may also perform error correction decoding on output data and may determine whether the error correction decoding is performed successfully, according to the error correction decoding result. The ECC circuit 366 may further output a signal according to the result and may correct erroneous bits of the data using the parity data.

The wear level control logic 367 may be used to manage wear levels for the nonvolatile memory cells of the flash memory 350, as is known in the art. As part of this wear level control operation, blocks which have reached the maximum number of P/E cycles may be marked as bad blocks. The wear level control logic 367 cooperates with the flash translation layer 369 of the firmware unit 362 to map the LPAs to the corresponding PPAs of the nonvolatile memory 370 of the flash memory 350.

The flash memory 350 according to the exemplary embodiment of FIG. 3 includes a two- or three-dimensional array of nonvolatile memory cells 370, a data input/output circuit 354, an address decoder 351, and a control unit 353. As described above, the array of nonvolatile memory cells 370 may be organized into pages, blocks, planes, and dies—in hierarchical order. Each memory block (or page) may represent an erase unit of the flash memory 350. Equivalently, each memory block, page or even single machine word (byte) may form a programming/write unit and/or read unit of the flash memory 350. Consequently, erase operations have to be performed on entire erase units while programming/write operations and read operations can be performed on the, potentially smaller, programming/write units and read units, respectively, which usually correspond to each other. An erase unit may thus comprise multiple programming/write units such that it may be necessary to determine by the control unit 353 of the flash memory 350, the control unit 363 of the memory controller 360 or the processing unit of the firmware unit 362, which erase unit a particular programming/write unit belongs to. From the erase status information stored in the memory unit 365 or the array of nonvolatile memory cells 370, the control unit 363 and/or the firmware unit 362 may then determine whether the programming/write unit belongs to an incompletely erased erase unit and return a signal correspondingly indicating a program state to an external host.

The data input/output circuit 354 may be connected with the array of nonvolatile memory cells 370 via a plurality of bit lines (BLs). The data I/O circuit 354 may exchange data with the memory controller 360 and may further perform a buffering function. The address decoder 351 may be connected with the array of nonvolatile memory cells 370 via a plurality of word lines (WLs) and selection lines (SSL and GSL). The address decoder 351 may select the word lines in response to an address ADD received from the memory controller 360.

The control unit 353 of the flash memory 350 may control programming, erasing, reading, and the like of the flash memory 350. For example, in order to execute a programming request, the control unit 353 may control the address decoder 351 such that a programming voltage is supplied to a selected word line, and may control the data I/O circuit 354 such that data is programmed/written to the selected memory cells.

According to the particular embodiment shown in FIG. 3, the array of nonvolatile memory cells 370 is divided into a user section 371 and a spare section 372. User section 371 and spare section 372 may simply refer to two sections of the same array of nonvolatile memory elements, but may also differ by their type of nonvolatile memory. As such, the user section 371 may be formed of the more compact NAND-type flash, while the much smaller spare section 372 may be formed of the more flexible NOR-type flash. Consequently, the user section 371 and the spare section 372 may also be physically separated from each other, wherein corresponding sections of the address decoder 351 and the data I/O circuit 354 may be provided. As will be discussed in detail below, the spare section 372 may be provided with such a size that a direct mapping between the memory elements of the spare section 372 and the erase units of the user section 371 exists. Such a mapping may even be implemented in hardware by connecting corresponding word and bit lines to corresponding erase units and memory elements. The size, and possibly dimensions, of the spare section 372 may be chosen such that it allows storing erase status information for each of the erase units of the user section 371. If erase status information shall be stored in the form of PPAs, sufficient memory of the spare section 372 may be provided to allow for a sufficient buffering functionality. The nonvolatile memory cells of the user section 371 are dedicated to the bulk storage of actual user data, such as images, videos, audio files, text files or the like, while the spare section 372 is dedicated to the storage of metadata in the form of erase status information.

As indicated above, the spare section 372 may be defined via hardware by providing dedicated addressing logic, e. g. as part of the address decoder 351 and the data I/O circuit 354, to address the memory elements of the spare section 372. In one particular embodiment, a completely separated memory unit comprising NOR-type flash memory or EEPROM-type memory may be provided as the spare section, potentially with independent addressing and control logics. Alternatively, the spare section 372 may be defined as a subset of the array of nonvolatile memory cells 370 by means of a correspondingly adapted flash translation layer 369. In this case, the flash translation layer 369 reserves a section of the array of nonvolatile memory cells 370 for the storage of erase status information. This particular embodiment will be described in detail in the following with respect to FIGS. 4 to 7.

FIG. 4 shows a more detailed structure of the array of nonvolatile memory cells 370 of the flash memory 350 of FIG. 3 according to a particular embodiment of the present disclosure. As mentioned above, the array of nonvolatile memory cells is divided into a spare section 472, dedicated to the storage of the erase status information for the erase units of the user section 471, which is itself dedicated to the bulk storage of user data. By way of example, FIG. 4 shows a subdivision of the user section 471 into a plurality of blocks 473-1 to 473-$m$, which at the same time represent the erase units of the user section 471. It shall be understood that the described structure is merely chosen to demonstrate a particular way of implementing the present disclosure and that alternative structures, in particular with respect to the arrangement and size of the erase units, can be chosen without limitation.

The spare section 472 comprises two blocks of nonvolatile memory cells 474-1 and 474-2 to provide a redundant storage system for the erase status information, wherein, at a particular time, one of the blocks 474-1 and 474-2 is used as the active block for storing the erase status information while the other block is used for a copy-over and erase operation when the erase status information is updated. This redundant layout enhances the safety of the presented fail-safe erase method and system against sudden disconnections or power-downs of the flash memory device. Each of the two blocks 474-1 and 474-2 shall have a size sufficient to store erase status information for all erase units of the user section 471, in particular, in the form of an erase unit map, wherein each of the erase units of the user section 471 is mapped to a memory element, possibly comprising multiple nonvolatile memory cells, of the block. It shall be understood that multiple blocks may be provided for the storage of such an erase unit map, if needed due to the size of the user section 471. Furthermore, more than one duplicate may be provided to implement a higher redundancy. For the sake of simplicity, in the following, a structure is assumed, wherein two blocks 474-1 and 474-2 are provided to store the erase unit map and its update in a copy-over and erase operation.

FIG. 5 shows an exemplary structure of a block 573 which can be applied to both the blocks 474-1 and 474-2 of the spare section 472 and the blocks 473-1 to 473-$m$ of the user section 471 in FIG. 4. According to the structure of FIG. 5, each block 573 includes a plurality of pages 575-1 to 575-$p$, each of the pages consisting of a data section 576 and a parity section 577. The data section 576 is dedicated to the bulk storage of user data while the parity section 577 may be dedicated to the storage of parity information, e. g. including error correction codes. The parity information may be generated when data is programmed to the data section 576, independent of the kind of data. The parity information may then be read together with the stored data during a read operation to allow for error detection. It shall be understood that the parity section 577 may fulfill other purposes too. By way of example, the parity section 577 may be used to mark a page which has reached the maximum number of P/E cycles as bad. Depending on the device, the size of the parity section 577 may vary. For an 8 kByte data section 576, 512 bytes may, for instance, be provided for the parity section 577.

FIG. 6 shows an exemplary embodiment of arranging memory elements for the storage of erase status information for a plurality of erase units according to the present disclosure. According to the structure in FIG. 6, each data section 676 of a page 675 of a block of nonvolatile memory cells dedicated to the storage of erase status information is divided into a plurality of flag segments 678-1 to 678-$q$, each of which stores the erase status information of a particular erase unit of the user section 471. While called flag segments, these memory elements for storing the erase status information of an individual erase unit do not necessarily consist of a single bit. As described above, a single bit memory element for the storage of erase status information may be provided by using an EEPROM-type memory for the memory section dedicated to storing erase status information. Alternatively, a single MLC memory cell may be provided to store the erase status information of a single erase unit. By way of example, a set flag may then be realized by an intermediate threshold voltage, such as "10" or "01", while a reset flag is realized by a higher threshold voltage, such as "00" (if '11' defines the ground state of the MLC). To allow for repeated P/E cycles, several MLCs may be provided in each flag segment 678-1 to 678-$q$. Depending on the implementation, the number q of flag segments in a page 675 may vary. As mentioned above, the parity section 677 may be provided as part of the page 675 to store parity information for the erase status information. However, such a parity section may not be able to fulfill the update requirements for repeated P/E cycles due to its nonvolatile nature. In such a case, the parity section 677 may be omitted for the blocks 573 storing the erase status information and the corresponding memory cells may be used for the storage of further flag segments. The flash translation layer 369 of the firmware unit 362 may be adapted accordingly.

A particular embodiment of defining flags in a nonvolatile memory for the storage of erase status information according to the present disclosure is shown in FIG. 7. In this particular embodiment, a flag segment 778, i.e. a memory element for the storage and update of erase status information of a single erase unit of the user section 471, comprises multiple (four in the case shown in the figure) pairs 779-1 to 779-4 of nonvolatile memory cells (SLCs), which each store a single bit. Each of the pairs 779-1 to 779-4 has a first memory cell for indicating a pending erase operation (right-hand cell) and a second memory cell for indicating a completed erase operation (left-hand cell). A big-endian ordering is chosen for simplicity in the example in FIG. 7. However, endianness may be modified as needed without limitation.

The present example shown in FIG. 7 specifies a bit value of '1' for nonvolatile memory cells in their basic state, i.e. erase state, and a bit value of '0' for nonvolatile memory cells in their programmed state P. It can be seen from the figure that the erase unit corresponding to the flag segment 778 has already been scheduled for an erase operation, which has been completed (indicated by the state '00' of the right-most pair 779-1). At the present state, the same erase unit has been scheduled for a further erase operation, which has, however, not been completed (indicated by the state '10' of the pair 779-2). This may be the result of a sudden disconnection or power-down of the flash memory device which interrupted an ongoing physical erase operation for the corresponding erase unit. The remaining two pairs 779-3 and 779-4 have not been modified yet and remain available for further P/E cycles.

By reading the flag segment 778 and determining the total number of bits that are set, the control unit 363 and/or a processing unit of the firmware unit 362 of the memory controller 360 may easily determine the erase status of the corresponding erase unit. An even number of set bits indicates a completed erase operation or a programmed state of the erase unit (i.e. no erase operation scheduled), while an odd number of set bits (as in the figure) indicates an incompletely erased erase unit. Upon determination of such an incomplete erase state, e. g. as part of an initialization procedure of the flash memory device, the corresponding erase unit may be scheduled for an erase operation, e. g. at a time when the flash memory device is in an idle state. Also, determination of an incomplete erase state makes the memory controller 360 return a signal indicating a program state for the programming/write units belonging to the incompletely erased erase unit. As a consequence, no data is written to or read from an incompletely erased erase unit.

As shown in FIG. 4, two blocks 474-1 and 474-2 may be provided to allow for a copy-over and erase operation with respect to the erase unit map stored in one of them. In the embodiment of FIG. 7, the pairs 779-1 to 779-4 of SLCs of a flag segment 778 for a particular erase unit will be used up after four P/E cycles such that the corresponding memory cells have to be erased before any further update of the erase status information may be performed. A similar situation occurs, if all the MLCs of a flag segment for a particular erase unit are in the state of the highest threshold voltage (typically '00'). In this case, an update of the erase status information will require the update of the entire block, e. g. 474-1, to be copied over to an empty block, e. g. 474-2, and the previously used block, i.e. 474-1, to be erased afterwards. To reduce overhead, the block 474-1 may first be updated for all erase units and then copied over. Alternatively or in addition, the updated block 474-1 may be submitted to a reduction processing of all flag segments, wherein an even number of set bits of a particular flag segment 778 is converted into the basic state of all pairs 779-1 to 779-4 of the flag segment 778, i.e. a series of '1' bits in the structure of FIG. 7, and an odd number of set bits of a particular flag segment 778 is converted into a single set bit, i.e. into '11111110' in the structure of FIG. 7. By this reduction processing, all flag segments 778 of the updated block are 'rejuvenated' before being written to the empty block 474-2 and unnecessary overhead through repeated copy-over and erase operations can be avoided.

Figure 8:
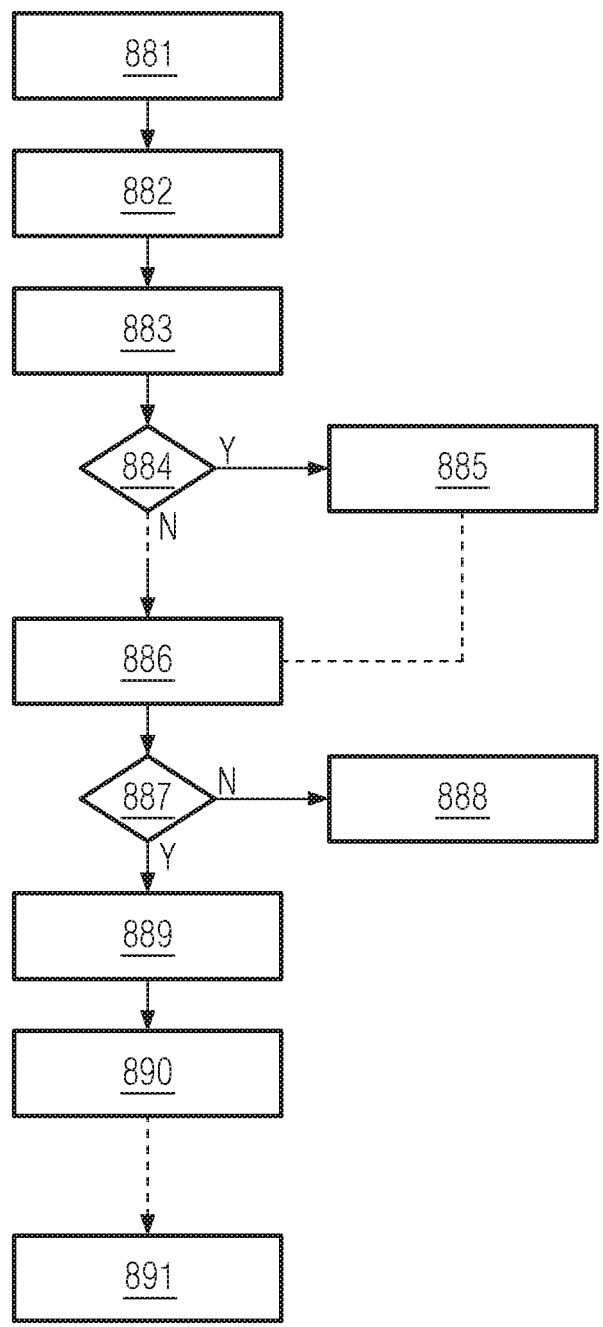
FIG. 8 shows a flowchart summarizing a method of operating a flash memory device according to the present disclosure.

FIG. 8 shows a flowchart summarizing a fail-safe erase method for flash memory devices according to the present disclosure. In step 881 of the disclosed method, a memory controller of a flash memory device receives an erase request, in particular from an external host, wherein the erase request indicates at least one erase unit, each erase unit comprising a number of nonvolatile memory cells. As discussed above, the at least one erase unit may be indicated by a list of logical page addresses (LPAs) and/or physical page addresses (PPAs) of the erase units to be erased and/or by PPAs indicating the boundaries of continuous sections of erase units of the flash memory. Also, the erase request may be implicitly included in a programming/write request which involves a copy-over and erase operation as described above.

After receiving the erase request, the memory controller stores erase status information for each of the erase units indicated in the erase request in a memory of the flash memory device, for instance by setting a flag indicating a pending erase request, in step 882. In step 883, the memory controller performs the physical erase operations on the erase units indicated in the erase request. As mentioned above, these erase operations may be carried out at a later time, when the flash memory device is in an idle state. Also, the erase operations may be carried out as the result of an initialization procedure which detected incompletely erased erase units.

The memory controller then determines whether the physical erase operations have been completed in step 884. If so, the erase status information of the corresponding erase unit is updated in the memory of the flash memory device in step 885 and the memory controller continues with the erase operation on the next erase unit. However, the flash memory device may be disconnected from the external host and/or a power supply while performing the physical erase operations. As a result of this interruption, incompletely erased erase units may be present in the flash memory.

As described above, the erase status information indicating a pending erase operation may be stored by setting a flag in the memory of the flash memory device dedicated to the storage of erase status information. In this case, the flag may be reset or a further flag indicating completion of the erase operation may be set in the memory when updating the erase status information upon completion of the physical erase operation in step 883. From the stored erase status information, the memory controller is able to determine whether an erase unit has been completely erased or not.

At a later stage, e. g. after reconnecting or powering-up the flash memory device, the memory controller may receive a read request or programming/write request, in particular from the external host, in step 886, wherein the read request or programming/write request indicates at least one programming/write unit, each programming/write unit comprising a number of nonvolatile memory cells to be read or programmed. Instead of directly attempting to read or write the data included in the read request or programming/write request to the indicated programming/write units, the memory controller first determines whether at least one erase unit corresponding to the at least one programming/write unit has not been completely erased. To this end, the memory controller determines the erase unit(s) corresponding to the read unit or programming/write unit(s) specified in the read request or programming/write request by means of the flash translation layer and reads the stored erase status information from the dedicated memory of the flash memory device. Based on the stored erase status information, the memory controller can easily determine whether a particular erase unit has not been completely erased in step 887. If it is determined that the erase unit has been completely erased, the memory controller may simply read or write the data included in the read request or programming/write request from the corresponding read unit(s) or to the corresponding programming/write unit(s) in step 888. However, if it is determined that the erase unit has not been completely erased, the memory controller returns a signal indicating a program state P, in particular a fully programmed state, for the incompletely erased erase unit in step 889. In addition, the erase unit is scheduled for an erase operation in step 890. The erase unit may in particular be scheduled for an erase operation upon reception of a corresponding erase request issued by the external host in response to the returned signal indicating a fully programmed erase unit.

The present method thus pretends that an incompletely erased erase unit has been fully programmed by returning a program state P, typically a bit value of '0', for every bit in the corresponding programming/write unit(s). At the same time, the memory controller, may automatically or in response to a corresponding erase request by the external host, strive to complete the missing erase operation in step 891 'behind the scenes' by scheduling the erase unit for an erase operation. To the external host, the flash memory device will appear as a flash memory device with fully programmed erase units instead of incompletely erased erase units. As a consequence, the flash memory device, although corrupted by a sudden disconnection or power-down, appears as an intact flash memory device to an external controller. Even if the renewed scheduling for an erase operation fails due to another sudden disconnection, the erase status information indicating an incompletely erased erase unit remains intact due to the nonvolatile nature of the memory where it is stored.

The presented method and device therefore provide a fail-safe erase method and device which can cope with unpredictable interruptions of ongoing erase operations and prevent the return of corrupted data from partially erased blocks.

The invention claimed is:

1. A method of operating a flash memory device comprising a plurality of nonvolatile memory cells, the method comprising:
   receiving a first request from an external host indicating a first unit that includes a fixed number of nonvolatile memory cells, wherein the first request is one of a read request or a programming/write request; and
   determining, based on stored erase status information for a first erase unit indicating an incompletely-erased erase unit, that the first erase unit corresponding to the first unit has not been completely erased, wherein the stored erase status information is included in a memory of the flash memory device.

2. The method of claim 1, wherein the memory that stores the stored erase status information comprises a nonvolatile memory that includes the plurality of nonvolatile memory cells.

3. The method of claim 1, further comprising returning a signal indicating a program state for the incompletely-erased erase unit, wherein the first unit comprises at least one read unit or programming/write unit.

4. The method of claim 3, wherein determining that the first erase unit corresponding to the first unit has not been completely erased comprises:
   mapping the at least one read unit or programming/write unit to the first erase unit; and
   reading the stored erase status information associated with the mapped first erase unit.

5. The method of claim 3, further comprising upon determining that the first erase unit has not been completely erased, scheduling the incompletely-erased erase unit for an erase operation.

6. The method of claim 3, further comprising receiving an erase request indicating the incompletely-erased erase unit in response to the returned signal.

7. The method of claim 6, further comprising completing the erase operation on the incompletely-erased erase unit during an idle state of the flash memory device.

8. The method of claim 1, further comprising:
   receiving an erase request from the external host that indicates at least one erase unit;
   storing erase status information for the at least one erase unit in the memory of the flash memory device, wherein the erase status information indicates a pending erase request for the at least one erase unit; and
   performing an erase operation on the at least one erase unit, wherein, upon completion of the erase operation, the erase status information is updated to indicate that the at least one erase unit is completely erased.

9. The method of claim 8, wherein storing the erase status information comprises setting a flag indicating a pending erase operation for the at least one erase unit in the memory.

10. The method of claim 9, further comprising
   setting a further flag indicating completion of the erase operation for the at least one erase unit in the memory; or
   resetting the flag indicating the pending erase operation for the at least one erase unit in the memory.

11. The method of claim 8, wherein storing the erase status information comprises:

storing mapping information for the at least one erase unit in the memory; and erasing the mapping information.

12. A flash memory device comprising:
   a flash memory comprising a plurality of nonvolatile memory cells divided into a plurality of erase units;
   a memory section configured to store stored erase status information that indicates erase statuses of the plurality of erase units; and
   a memory controller configured to:
      receive a first request from an external host indicating a first unit that includes a fixed number of nonvolatile memory cells in the flash memory, wherein the first request is one of a read request or a programming/write request; and
      determine, based on a first portion of the stored erase status information, for a first erase unit in the plurality of erase units, that indicates an incompletely-erased erase unit, that the first erase unit corresponding to the first unit has not been completely erased.

13. The flash memory device of claim 12, wherein the memory section comprises part of the flash memory.

14. The flash memory device of claim 13, wherein the flash memory comprises a first section comprising a first part of the plurality of nonvolatile memory cells, and a spare section comprising a second part of the plurality of nonvolatile memory cells, and wherein the memory section comprises part of the spare section.

15. The flash memory device of claim 12, wherein the memory controller comprises a memory unit, and the memory section comprises part of the memory unit.

16. The flash memory device of claim 12,
   wherein the memory controller comprises a firmware unit, and the firmware unit comprises a flash translation layer; and
   wherein the firmware unit is configured to:
      receive an erase request indicating at least one erase unit;
      store erase status information for the at least one erase unit in the memory section;
      perform an erase operation on the at least one erase unit; and
      update the stored erase status information upon completion of the erase operation.

17. The flash memory device of claim 12, wherein the memory controller is further configured to:
   return a signal indicating a program state for the incompletely-erased erase unit corresponding to the first unit, and
   wherein the signal further indicates that the incompletely-erased erase unit is to be fully programmed.

* * * * *